United States Patent [19]
Shibata et al.

[11] Patent Number: 5,528,540
[45] Date of Patent: Jun. 18, 1996

[54] REDUNDANT ADDRESS DECODER

[75] Inventors: Kenji Shibata; Yukinori Kodama, both of Kawasaki, Japan

[73] Assignee: Fujitsu Limited, Kawasaki, Japan

[21] Appl. No.: 319,518

[22] Filed: Oct. 7, 1994

[30]    Foreign Application Priority Data

Oct. 8, 1993  [JP]  Japan ..................................... 5-253509

[51] Int. Cl.$^6$ ................................................. G11C 29/00
[52] U.S. Cl. ................ 365/200; 365/189.07; 365/230.06
[58] Field of Search ............................... 365/230.06, 200, 365/201, 189.07

[56]    References Cited

U.S. PATENT DOCUMENTS 5,359,559  10/1994  Nomura et al. ................ 365/230.06 X Primary Examiner—Do Hyun Yoo
Attorney, Agent, or Firm—Nikaido, Marmelstein, Murray & Oram

[57]    ABSTRACT

A comparator 5 outputs a match signal EQ and a redundancy selection signal with active when an address A4 to A0 is a redundant address in order to select a redundant word line RWL0 or RWL1 for replacing word line WL0 or WL1. A decoder 61 supplies a potential VCC+α to a drain of an FET 60 when both the match signal EQ and the redundancy selection signal S0 are active. A gate driver 62 supplies a high potential VCC to the gate of the FET 60 for turning ON the FET 60 when the redundancy selection signal S0 is active.

8 Claims, 5 Drawing Sheets

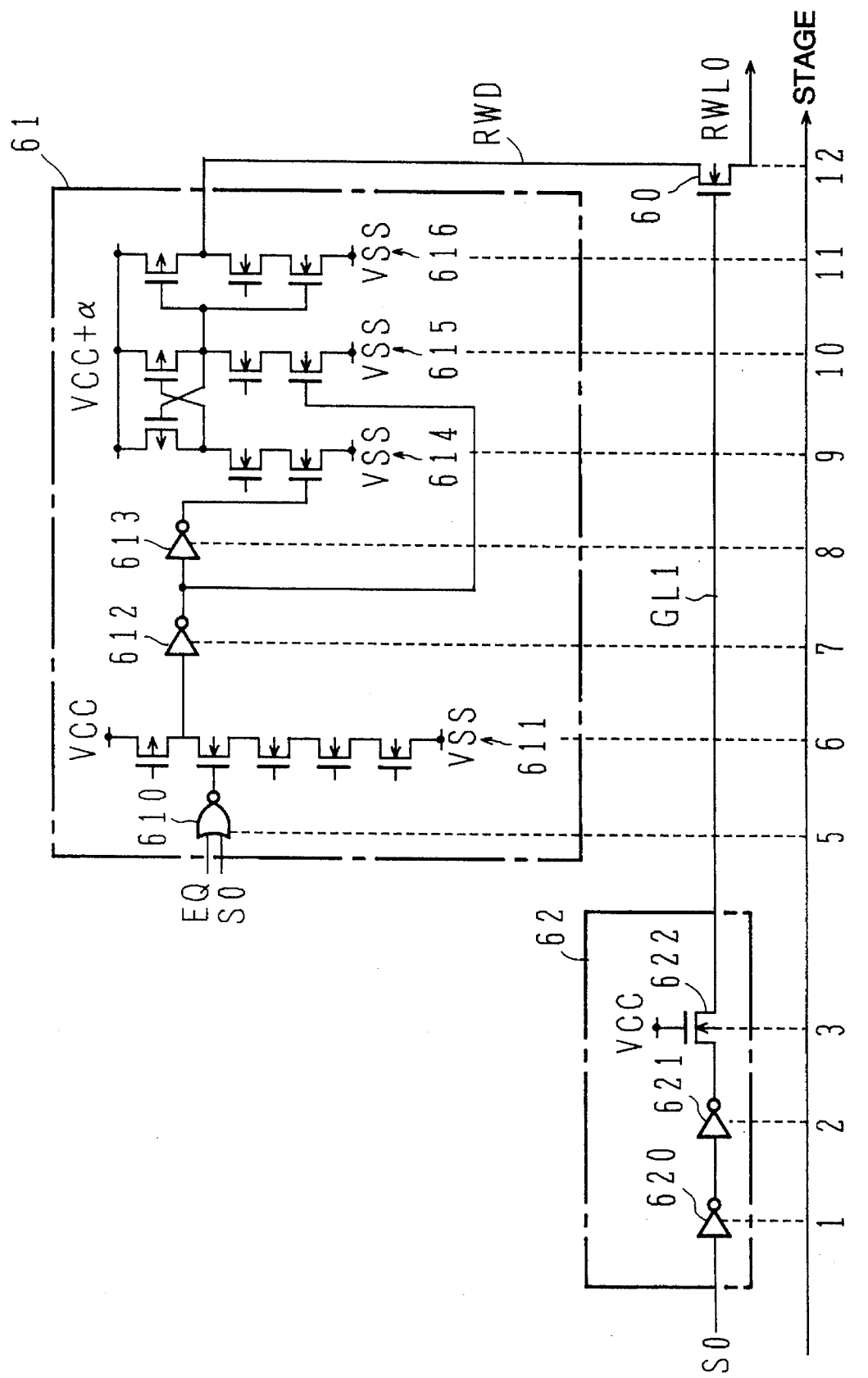

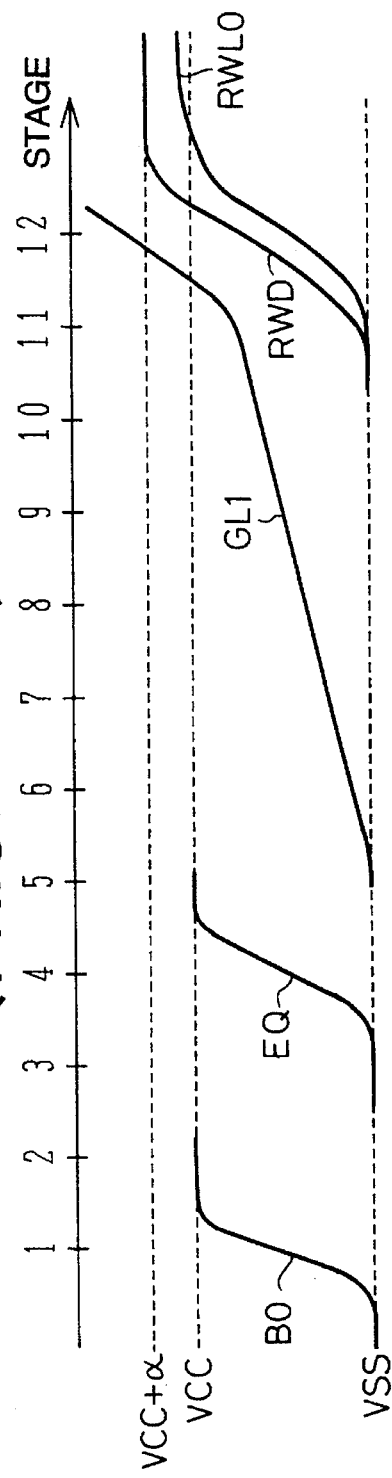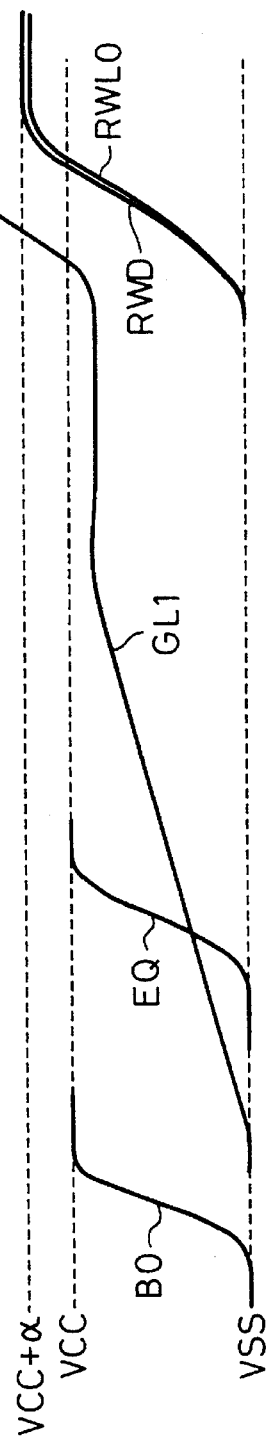

5,528,540

REDUNDANT ADDRESS DECODER

BACKGROUND OF THE INVENTION

The present invention relates to an address decoder for replacing defective memory cells with redundant (auxiliary) memory cells, which may be used in various types of semiconductor memory devices.

As the memory capacity of a semiconductor memory device increases, the production yield in its manufacture tends to decline due to defective memory cells. To deal with this problem, redundant memory cells are provided in the semiconductor memory device, to improve the yield by replacing defective memory cells with the redundant memory cells. The replacement is performed in units of rows or columns in the memory cell array.

FIG. 5 shows a circuit related to the row address decoder which is provided with a function to replace defective memory cells in units of rows. For the sake of simplification, in the circuit in FIG. 5, the addresses are assigned five bits, A4 to A0 and 2 redundant word lines RWL0 and RWL1 are provided for the 32 word lines WL0 to WL31 which are obtained by decoding the addresses.

The addresses A4 to A0 are supplied to the pre-decoder 2 via the address buffer 1 and, for instance, the two bits A2 and A1 are decoded in the pre-decoder 2 to become B0 to B3 and the addresses A4, A3 and A0 and B0 to B3, which are addresses A2 and A1 when decoded, are supplied to the main decoder 3 to be fully decoded. Then, one of the word lines WL0 to WL31 is selected and is set to high. The word line WL0, for example, may be selected in the following manner using the nMOS transistor 30 for drive and the decoders 31 and 32: When the output of the decoder 32 is set to high (potential VCC) and, at the same time, the output of the decoder 31 is set to high (potential VCC+α) the nMOS transistor 30 is turned ON to set the word line WL0 to high.

If defective memory cells are detected in pre-shipment tests of the semiconductor memory device, the following information on the redundant addresses is written in the redundant address memory unit 4, with the row address that includes the defective memory cell assigned as RA. In other words, the low order three bits of the RA and the redundancy selection signals S0, S1 are written at the addresses indicated with the two high-order bits of the RA in the redundant address memory unit 4. The redundancy selection signal S0 is the select/not select ='1'/'0' of the redundant word line RWL0 and the redundancy selection signal S1 is the select/not select ='1'/'0' of the redundant word line RWL1. This write is performed, for instance, by melting a fuse electrically.

The aforementioned three bits of the RA that are thus output from the redundant address memory unit 4 are supplied to one set of the input terminals of the comparator circuit 5 and to the other set of input terminals of the comparator circuit 5, the low order three bits of the address from the address buffer 1 are supplied. If these three-bit sets match, the comparator circuit 5 sets the match signal EQ to high. The match signal EQ is supplied to the decoder 31 which is a component within the main decoder 3 and all the other circuits that are similar to it. When the match signal EQ is at high, the output from the decoder 31 and the outputs from all the other similar circuits in the main decoder 3 are at the ground potential VSS.

The redundant decoder 6 is provided with two sets of components, one of which consists of the nMOS transistor 60 which is identical to the nMOS transistor 30 in the main decoder 3, the decoder 61 and the gate driver 62, which are similar to the decoders 31 and 32 in the main decoder 3. The other set consists of the nMOS transistor 63, the decoder 64 and the gate driver 65. The only difference between the gate drivers 62 and the decoder 32 is that the decoder 32 has a decoding circuit added to the back stage of the gate driver.

The match signal EQ is also supplied to the gate drivers 62 and 65. The redundancy selection signals S0 and S1 are supplied to the decoders 61 and 64 respectively. The output of the decoder 61 is set to high (VCC+α) when the match signal EQ is at '1' and the redundancy selection signal S0 is at '1'. The output of the decoder 64 is set to high (VCC+α) when the match signal EQ is at '1' and the redundancy selection signal S1 is at '1'. The outputs of the gate drivers 62 and 65 are set to high (VCC) when the match signal EQ is at '1'.

With this structure, when there is a defect in the first line of the memory cell, for example, the redundant word line RWL0 is selected to replace the word line WL0. The word line WL0 is set to the ground potential VSS and the redundant word line RWL0 is set to the potential. VCC+α.

The number of stages in the logic gates between the input and the output of the main decoder 3, the number of stages in the logic gates between the input and the output of the comparator circuit 5 and the number of stages in the logic gates between the input and the output of the redundant decoder 6 is relatively large, for example, at 12, 4 and 8 respectively, as shown in FIGS. 2 and 3. While the difference in the number of stages of logic gates in the decoder 31 and the decoder 32 is 8, the difference in the number of stages between the decoder 61 and the gate driver 62 is relatively low, i.e., 3.

Now, in order to ensure sufficient drive capacity for the nMOS transistor that drives the word lines, for example, the nMOS transistor 60, the gate of the nMOS transistor 60 must be fully charged with the power-supply potential. However, since the nMOS transistor 622 in FIG. 3, for example that is connected to this gate, operates at approximately the threshold potential when its source nears the power-supply voltage VCC, the ON resistance is increased and it takes a considerable length of time to charge the gate of the nMOS transistor 60. Because of this, the double boost wiring GL1 that connects the output terminal of the gate driver 62 with the gate of the nMOS transistor 60 is increased comparatively gently as shown in FIG. 4A.

Thus, when the clock frequency is raised in order to access the semiconductor memory device at high speed, the output potential of tile decoder 61 rises before the potential of the double boost wiring GL1 has risen sufficiently. As a result, the speed at which the potential of the redundant word line RWL0 rises to the vicinity of the VCC+α is reduced. This delays access to the memory cell. Even if the precharge time for the redundant word line RWL0 is lengthened to ensure that the potential of the redundant word line RWL0 will rise sufficiently, the access is delayed for that amount of time.

SUMMARY OF THE INVENTION

Accordingly, an object of the present invention is to provide a redundant address decoder which can improve the memory access speed by providing a sufficient increase in potential for a redundant word line when the redundant word line is selected.

In accordance with the present invention, there is provided a redundant address decoder comprising: a first circuit for outputting a match signal with active state when an input address AD matches a stored redundant address RA and for outputting a redundancy selection signal in response to a first part AD1 of the input address AD; an FET having a source connected to a redundant word line, a drain and a gate; a second circuit for supplying to the drain of the FET a high potential in case of the match signal being active and the redundancy selection signal being active and a low potential in case of others; and a third circuit for supplying to the gate of the FET a high potential in case of the redundancy selection signal being active and a low potential in case of the redundancy selection signal being inactive.

The FET may be an enhanced type MIS FET such as nMOS FET or an enhanced type MES FET such as GaAs FET.

With the present invention, since the third circuit can start operating sooner than in the prior art by the signal propagation delay time in the comparator portion when the potential of the drain of the FET rises, the potential of the gate of the FET will have already risen sufficiently high. As a result, the increase in potential of the redundant word line is sufficient, improving the memory access speed.

In the first mode of the present invention, the first circuit comprises: a redundant address memory circuit for outputting a value D2 and a redundancy selection signal in response to the first part AD1 of the address AD, the value D2 being equal to a first part RA1 of the redundant address RA in case of the first part AD1 of the address AD being equal to a second part RA2 of the redundant address RA; and a comparator circuit for comparing the second part AD2 of the address AD and the value D2 from the redundant address memory circuit and for outputting the match signal with active state when the AD2 and the D2 match each other.

In the second mode of the present invention, the second circuit outputs a high potential more than that of the third circuit.

In the third mode of the present invention, the redundant address decoder further comprises an address buffer resistor for holding an input address and outputting the address AD.

In the fourth mode of the present invention any one of the redundant address decoder described above is in a semiconductor memory device.

BRIEF DESCRIPTION OF THE DRAWINGS

FIG. 3 shows a schematic diagram of another part of the circuit in FIG. 1 to indicate the number of logical gate stages;

FIG. 4A is a signal waveform diagram that shows an operation performed in the circuit in FIG. 5;

FIG. 4B is a signal waveform diagram that shows an operation performed in the circuit in FIG. 1.

DESCRIPTION OF THE PREFERRED EMBODIMENT

Figure 1:
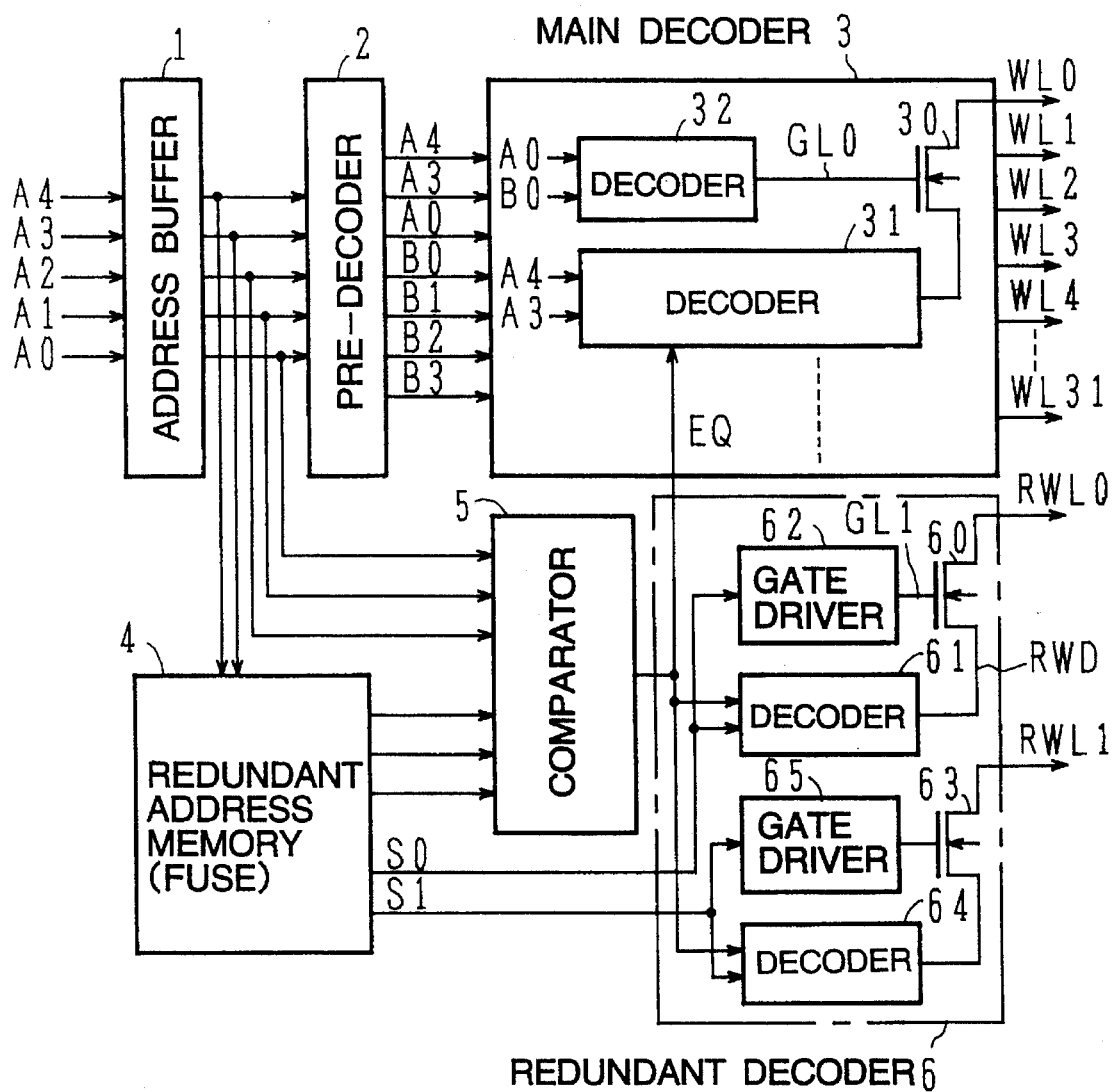
FIG. 1 is a block diagram showing a circuit related to the row address decoder in an embodiment according to the present invention.

FIG. 1 shows a circuit related to the row address decoder in an embodiment according to the present invention. The same reference numbers are assigned to components that are identical to those in FIG. 5 and their explanation is omitted here.

Figure 5:
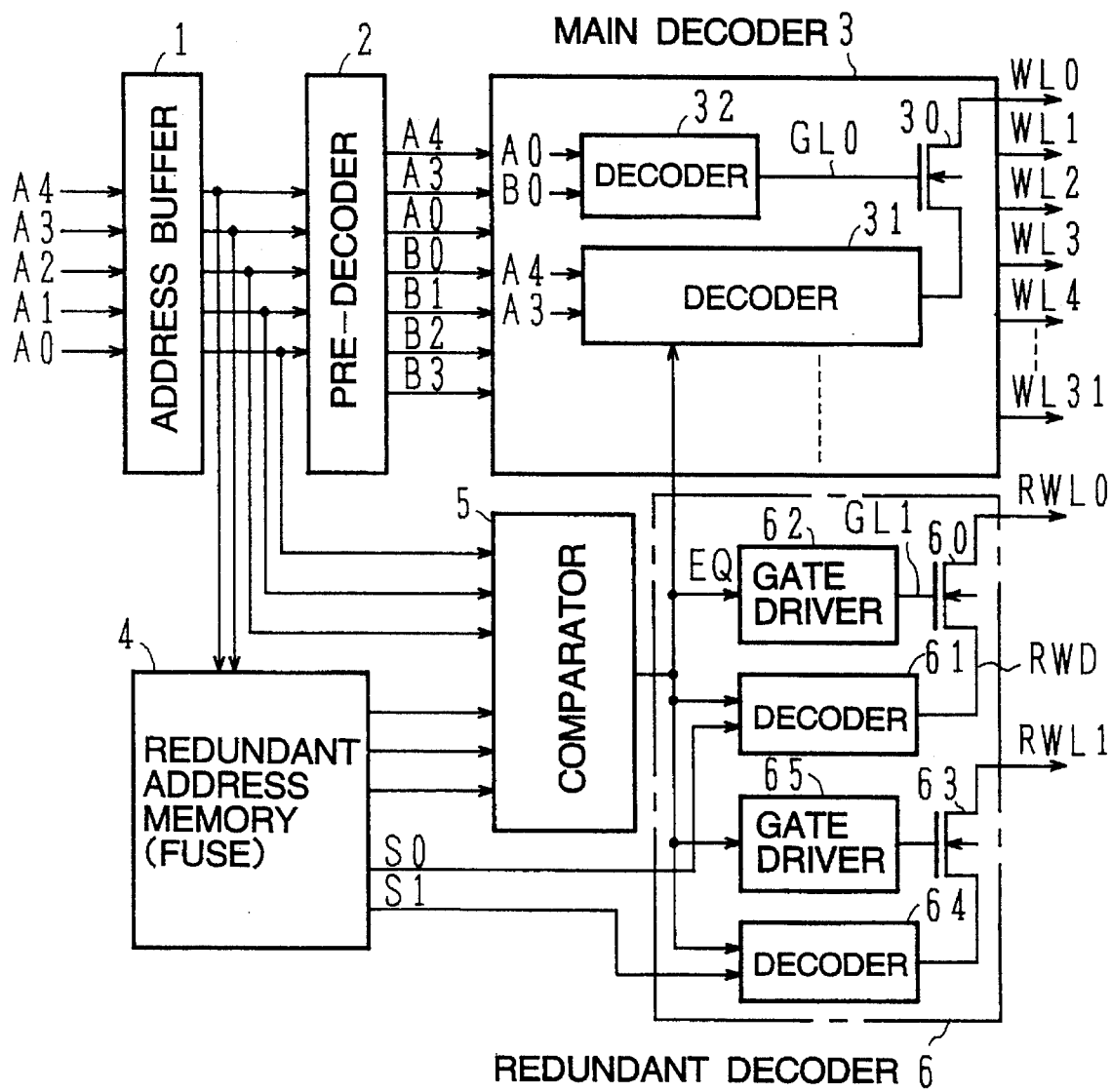
FIG. 5 is a block diagram that shows a circuit related to a row address decoder in the prior art.

The various circuit blocks shown in FIG. 1 are identical to those shown in FIG. 5 and the only differences from the circuit in FIG. 5 are in the wiring.

Namely, while the match signal EQ from the comparator circuit 5 is supplied to the gate drivers 62 and 65 in FIG. 5, the redundancy selection signal S0 is supplied to the gate driver 62 and the redundancy selection signal S1 is supplied to the gate driver 65 in this embodiment.

The redundancy selection signals S0 and S1 are output even when the match signal EQ is at low. However, the redundant word line RWL0 is set to high when both the outputs from decoder 61 and the gate driver 62 are at high. There is no trouble here, since the match signal EQ is always set to high when the decoder 61 is at high.

With this, since the gate driver 62 can start operating sooner than in the prior art by the equivalent of the signal propagation delay time for the number of stages of logic gates in the comparator circuit 5, e.g., four stages, when the potential of the wire RWD that connects the output terminal of the decoder 61 and the drain of the nMOS transistor 60 rises, the potential of the wire GL1 which is connected to the gate of the nMOS transistor 60 will have already risen sufficiently as shown in FIG. 4B. As a result, the increase in potential of the redundant word line RWL0 is sufficient, improving the memory access speed.

Figure 2:
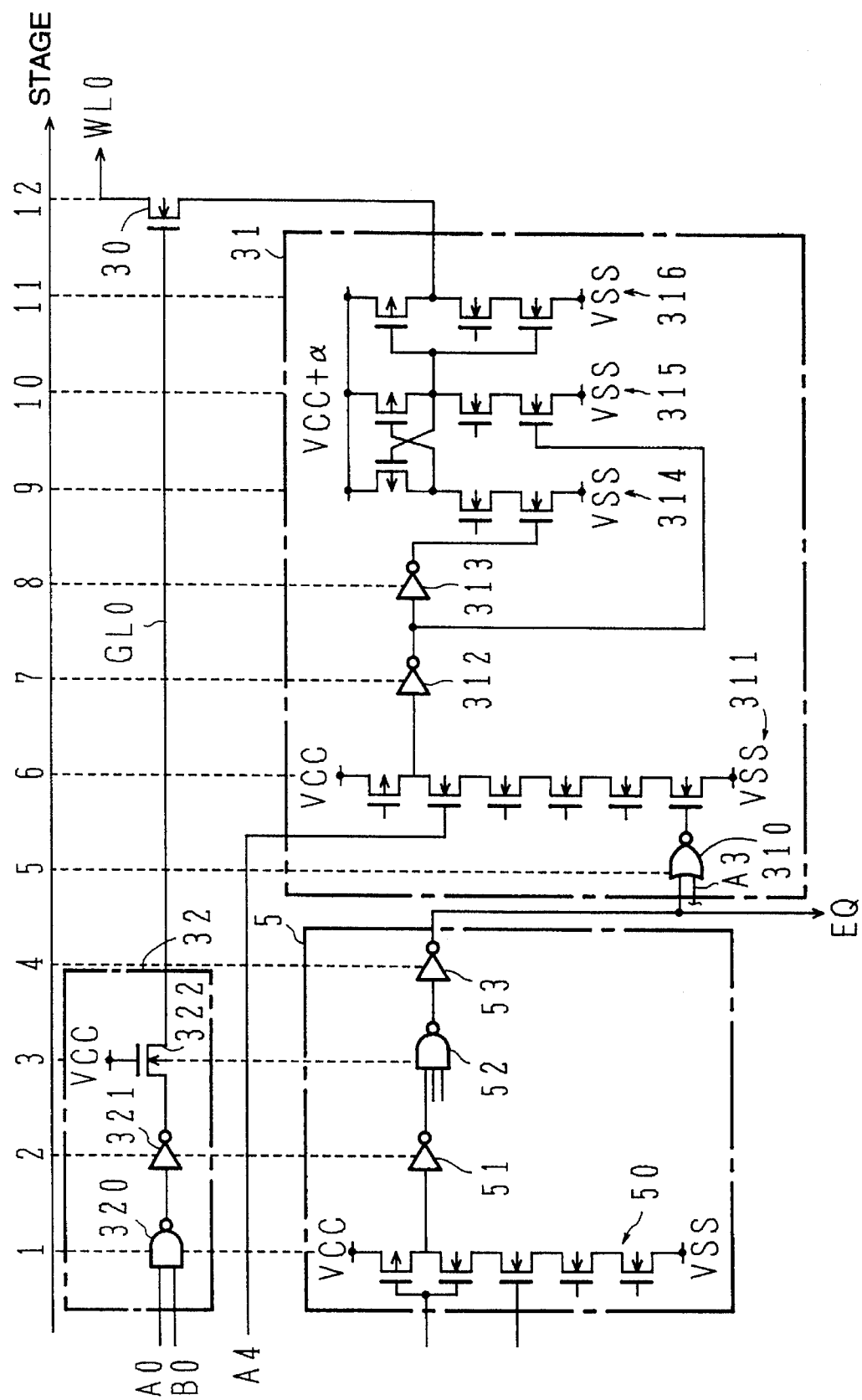
FIG. 2 shows a schematic diagram of a part of the circuit in FIG. 1 to indicate the number of logical gate stages.

FIGS. 2 and 3 show the number of stages of the logic gates using a schematic circuit. In FIG. 2, the comparator circuit 5 is provided with 4-stage logic gates 50 to 53. The decoder 31 is provided with 7-stage logic gates 310 to 316 and the decoder 32 is provided with 3-stage logic gates 320 to 322. The logic gates 314, 315 and 316 constitute a step-up circuit that shifts the signal level from the power-supply potential VCC to a slightly higher potential VCC+α for speeding up the access. In FIG. 3, the decoder 61 and the gate driver 62 are similar to the decoders 31 and 32 respectively in FIG. 2, and the decoder 61 is provided with 7-stage logic gates 610 to 616 and the gate driver 62 is provided with the 3-stage logic gates 620 to 622. The logic gates 614, 615 and 616 constitute a step-up circuit that shifts the signal level to the potential VCC+α for speeding up the access.

Although the present invention has been described in its preferred embodiments, it is to be understood that the invention is not limited thereto and that various changes and modifications may be made without departing from the spirit and scope of the invention. For example, in the embodiment described above, a redundant decoder for row addresses is explained, but the present invention can be similarly applied to a redundant decoder for column addresses. Also, although in the circuit in FIG. 1, the decoder 32 is provided with a decoding function, the structure may be such that only the decoder 31 has a decoding function. Furthermore, if the VCC has potential high enough to drive the word lines at high speed, then the α may be 0. The nMOS transistor 60 may be other type of FET such as an enhanced type FET of MIS or MES structure.

What is claimed is:

1. A redundant address decoder comprising:
    a first circuit for outputting a match signal with active state when an input address AD matches a stored redundant address RA and for outputting a redundancy selection signal when a first part AD1 of said input address AD matches a first part RA1 of said redundant address RA;

an FET having a source connected to a redundant word line, a drain and a gate;

a second circuit for supplying to said drain of said FET a high potential in case of both said match signal and said redundancy selection signal being active and a low potential in case of said match signal or said redundancy selection signal being inactive; and a third circuit for supplying to said gate of said FET a high potential in case of said redundancy selection signal being active and a low potential in case of said redundancy selection signal being inactive.

2. A redundant address decoder according to claim 1 wherein said first circuit comprises:

a redundant address memory circuit having an address input adapted to receive said first part AD1 of said input address AD and having a data output for supplying both a second part RA2 of said redundant address RA and said redundancy selection signal when said first part AD1 of said input address AD matches said first part RA1 of said redundant address RA; and a comparator circuit for comparing a second part AD2 of said input address AD and a data D2 from said data output of said redundant address memory circuit, said comparator circuit outputting said match signal with active state when said second part AD2 of said input address and said data D2 from said data output of said redundant address memory circuit match each other.

3. A redundant address decoder according to claim 2, wherein said second circuit outputs a potential higher than a potential of said third circuit.

4. A redundant address decoder according to claim 2, further comprising an address buffer for holding an input address and for outputting said input address AD.

5. A semiconductor memory device comprising redundant address decoder, said redundant address decoder including:

a first circuit for outputting a match signal with active state when an input address AD matches a stored redundant address RA and for outputting a redundancy selection signal when a first part AD1 of said input address AD matches a first part RA1 of said redundant address RA;

an FET having a source connected to a redundant word line, a drain and a gate;

a second circuit for supplying to said drain of said FET a high potential in case of both said match signal and said redundancy selection signal being active and a low potential in case of said match signal or said redundancy selection signal being inactive; and a third circuit for supplying to said gate of said FET a high potential in case of said redundancy selection signal being active and a low potential in case of said redundancy selection signal being inactive.

6. A semiconductor memory device comprising a redundant address decoder, said redundant address decoder including:

a first circuit for outputting a match signal with active state when an input address AD matches a stored redundant address RA and for outputting a redundancy selection signal when a first part AD1 of said input address AD matches a first part RA1 of said redundant address RA, said first circuit comprising a redundant address memory circuit having an address input adapted to receive said first part AD1 of said input address AD, and having a data output for supplying both a second part RA2 of said redundant address RA and said redundancy selection signal when said first part AD1 of said input address AD matches said first part RA1 of said redundant address RA, said first circuit also comprising a comparator circuit for comparing a second part AD2 of said input address AD and a data D2 from said data output of said redundant address memory circuit, said comparator circuit outputting said match signal with active state when said second part AD2 of said input address AD and said data D2 from said data output of said redundant address memory circuit match each other; said redundant address decoder further comprising an FET having a source connected to a redundant word line, a drain and a gate;

a second circuit for supplying to said drain of said FET a high potential in case of both said match signal and said redundancy selection signal being active and a low potential in case of said match signal or said redundancy selection signal being inactive; and third circuit for supplying to said gate of said FET a high potential in case of said redundancy selection signal being active and a low potential in case of said redundancy selection signal being inactive.

7. A semiconductor memory device comprising a redundant address decoder, said redundant address decoder including:

a first circuit for outputting a match signal with active state when an input address AD matches a stored redundant address RA and for outputting a redundancy selection signal when a first part AD1 of said input address AD matches a first part RA1 of said redundant address RA, said first circuit comprising a redundant address memory circuit having an address input adapted to receive said first part AD1 of said input address AD, and having a data output for supplying both a second part RA2 of said redundant address RA and said redundancy selection signal when said first part AD1 of said input address AD matches said first part RA1 of said redundant address RA, said first circuit also comprising a comparator circuit for comparing a second part AD2 of said input address AD and a data D2 from said data output of said redundant address memory circuit, said comparator circuit outputting said match signal with active state when said second part AD2 of said input address AD and said data D2 from said data output of said redundant address memory circuit match each other; said redundant address decoder further comprising an FET having a source connected to a redundant word line, a drain and a gate;

a second circuit for supplying to said drain of said FET a high potential in case of both said match signal and said redundancy selection signal being active and a low potential in case of said match signal or said redundancy selection signal being inactive; and a third circuit for supplying to said gate of said FET a high potential in case of said redundancy selection signal being active and a low potential in case of said redundancy selection signal being inactive;

wherein said second circuit outputs a potential, said potential being higher than a potential of said third circuit.

8. A semiconductor memory device comprising a redundant address decoder, said redundant address decoder including:

first circuit for outputting a match signal with active state when an input address AD matches a stored redundant address RA and for outputting a redundancy selection signal when a first part AD1 of said input address AD matches a first part RA1 of said redundant address RA, said first circuit comprising a redundant address memory circuit having an address input adapted to receive said first part AD1 of said input address AD, and having a data output for supplying both a second part RA2 of said redundant address RA and said redundancy selection signal when said first part AD1 of 8aid input address AD matches said first part RA1 of said redundant address RA, said first circuit also comprising a comparator circuit for comparing a second part AD2 of said input address AD and a data D2 from said data output of said redundant address memory circuit, said comparator circuit outputting said match signal with active state when said second part AD2 of said input address AD and said data D2 from said data output of said redundant address memory circuit match each other; said redundant address decoder further comprising an FET having a source connected to a redundant word line, a drain and a gate;

second circuit for supplying to said drain of said FET a high potential in case of both said match signal and said redundancy selection signal being active and a low potential in case of said match signal or said redundancy selection signal being inactive; and a third circuit for supplying to said gate of said FET a high potential in case of said redundancy selection signal being active and a low potential in case of said redundancy selection signal being inactive; said redundant address decoder further comprising an address buffer for holding an input address and for outputting said input address AD.

* * * * *